(12) United States Patent
Bencher

(10) Patent No.: US 10,014,184 B2
(45) Date of Patent: Jul. 3, 2018

(54) METHODS AND APPARATUS FOR FORMING A RESIST ARRAY USING CHEMICAL MECHANICAL PLANARIZATION

(71) Applicant: Applied Materials, Inc., Santa Clara, CA (US)

(72) Inventor: Christopher D. Bencher, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/916,557

(22) PCT Filed: Sep. 4, 2014

(86) PCT No.: PCT/US2014/054147
§ 371 (c)(1),
(2) Date: Mar. 3, 2016

(87) PCT Pub. No.: WO2015/035088
PCT Pub. Date: Mar. 12, 2015

(65) Prior Publication Data
US 2016/0343578 A1    Nov. 24, 2016

Related U.S. Application Data

(60) Provisional application No. 61/874,349, filed on Sep. 5, 2013.

(51) Int. Cl.
*H01L 21/302* (2006.01)
*H01L 21/3105* (2006.01)
(Continued)

(52) U.S. Cl.
CPC ...... *H01L 21/31058* (2013.01); *B24B 37/015* (2013.01); *B24B 37/04* (2013.01);
(Continued)

(58) Field of Classification Search
CPC .......... H01L 21/31058; H01L 21/0274; H01L 21/0277; H01L 21/31056; B24B 37/015
(Continued)

(56) References Cited

U.S. PATENT DOCUMENTS 8,791,024 B1 * 7/2014 Lu ...................... H01L 21/0274
257/E21.492
2002/0158342 A1 10/2002 Tuominen et al.
(Continued)

FOREIGN PATENT DOCUMENTS

KR    10-0731144 B1    6/2007

OTHER PUBLICATIONS

Office Action of U.S. Appl. No. 13/757,820 dated Mar. 6, 2014.
(Continued)

*Primary Examiner* — Nitin Parekh
(74) *Attorney, Agent, or Firm* — Dugan & Dugan, PC

(57) ABSTRACT

Methods, apparatus, and systems are provided for forming a resist array on a material to be patterned using chemical-mechanical planarization. The resist array may include an arrangement of two different materials that are adapted to react to activation energy differently relative to each other to enable selective removal of only one of the materials (e.g., one is reactive and the other is not reactive; one is slightly reactive and the other is very reactive; one is reactive in one domain and the other in an opposite domain). The first material may be disposed as isolated nodes between the second material. A subset of nodes may be selected from among the nodes in the array and the selected nodes may be exposed to activation energy to activate the nodes and create a mask from the resist array. Numerous additional aspects are disclosed.

9 Claims, 12 Drawing Sheets

(51) Int. Cl.
  *H01L 21/027* (2006.01)
  *B24B 37/015* (2012.01)
  *B24B 37/04* (2012.01)
  *G03F 7/00* (2006.01)
  *G03F 7/09* (2006.01)
  *B24B 37/20* (2012.01)
  *H01L 23/528* (2006.01)

(52) U.S. Cl.
  CPC ............ *B24B 37/20* (2013.01); *G03F 7/0035* (2013.01); *G03F 7/094* (2013.01); *H01L 21/0274* (2013.01); *H01L 21/0277* (2013.01); *H01L 21/31056* (2013.01); *H01L 23/528* (2013.01)

(58) Field of Classification Search
  USPC .................................................. 438/942, 947
  See application file for complete search history.

(56) References Cited

U.S. PATENT DOCUMENTS

| | | |
|---|---|---|
| 2005/0250052 A1 | 11/2005 | Nguyen |
| 2005/0250053 A1 | 11/2005 | Marsh et al. |
| 2008/0026525 A1 | 1/2008 | Lu et al. |
| 2008/0193658 A1 | 8/2008 | Millward |
| 2009/0117488 A1 | 5/2009 | Hirosaki et al. |
| 2009/0311635 A1 | 12/2009 | Chen et al. |
| 2010/0092873 A1 | 4/2010 | Sills et al. |
| 2010/0178618 A1 | 7/2010 | Hatakeyama et al. |
| 2010/0187658 A1 | 7/2010 | Wei |
| 2010/0279435 A1 | 11/2010 | Xu et al. |
| 2010/0294740 A1 | 11/2010 | Cheng et al. |
| 2011/0052883 A1 | 3/2011 | Jain et al. |
| 2011/0111345 A1 | 5/2011 | Allen et al. |
| 2012/0108054 A1 | 5/2012 | Tseng et al. |
| 2013/0129995 A1* | 5/2013 | Ouattara ................. G03F 7/092 428/209 |
| 2013/0200498 A1 | 8/2013 | Mangan |
| 2015/0093702 A1* | 4/2015 | Nyhus ................... G03F 7/0392 430/270.1 |
| 2015/0170961 A1* | 6/2015 | Romero ............ H01L 21/76838 438/641 |
| 2016/0204002 A1* | 7/2016 | Wallace ............ H01L 21/76897 257/773 |

OTHER PUBLICATIONS

Jun. 9, 2014 Reply to Mar. 6, 2014 Office Action of U.S. Appl. No. 13/757,820.

Final Office Action of U.S. Appl. No. 13/757,820 dated Jul. 31, 2014.

Oct. 3, 2014 Reply to Jul. 31, 2014 Final Office Action of U.S. Appl. No. 13/757,820.

Advisory Action of U.S. Appl. No. 13/757,820 dated Oct. 27, 2014.

International Preliminary Report on Patentability of International Application No. PCT/US2014/054147 dated Mar. 17, 2016.

Notice of Abandonment of U.S. Appl. No. 13/757,820 dated Mar. 6, 2015.

International Search Report and Written Opinion of International Application No. PCT/US2014/054147 dated Dec. 15, 2014.

Taiwan Search Report of Taiwan Application No. 103130852 dated Dec. 11, 2017.

\* cited by examiner

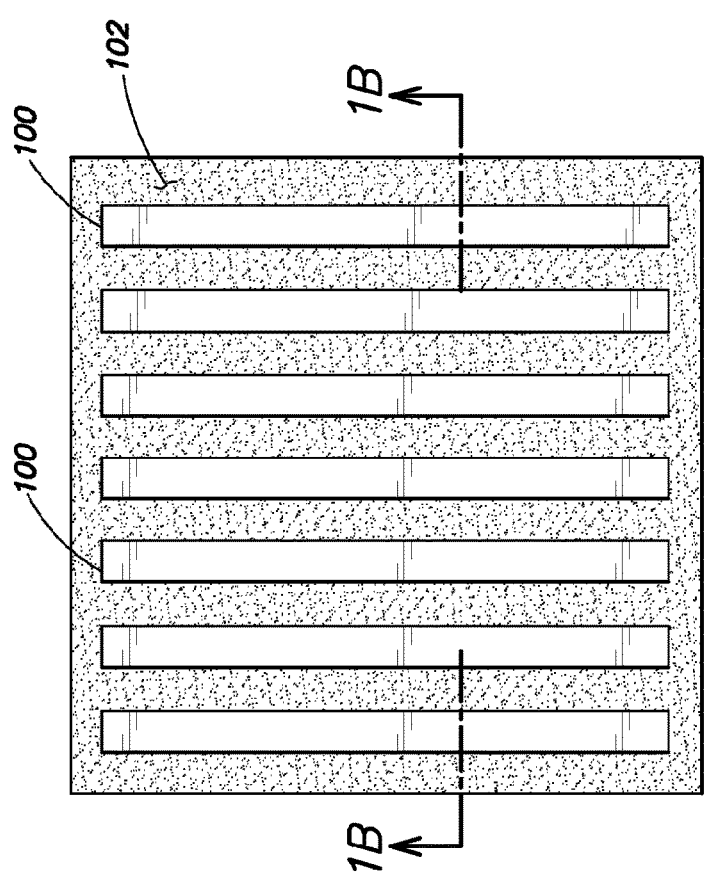
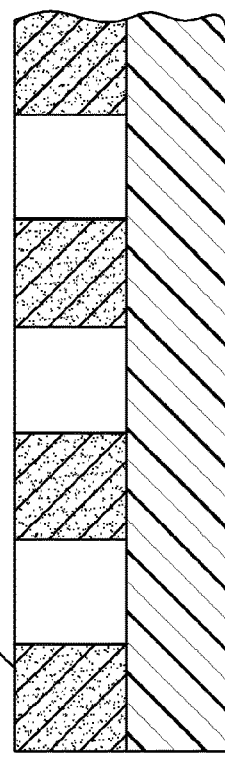
FIG. 1A
FIG. 1B

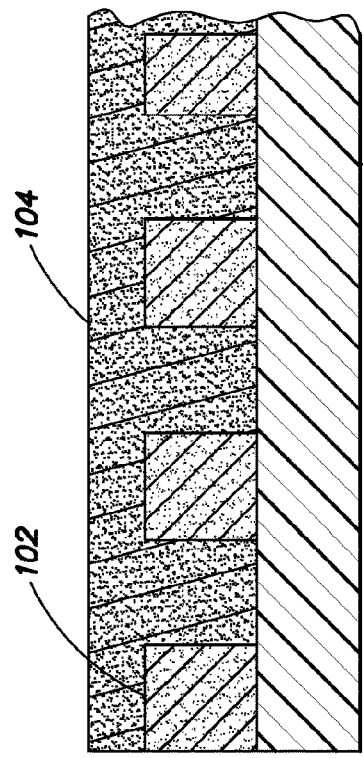
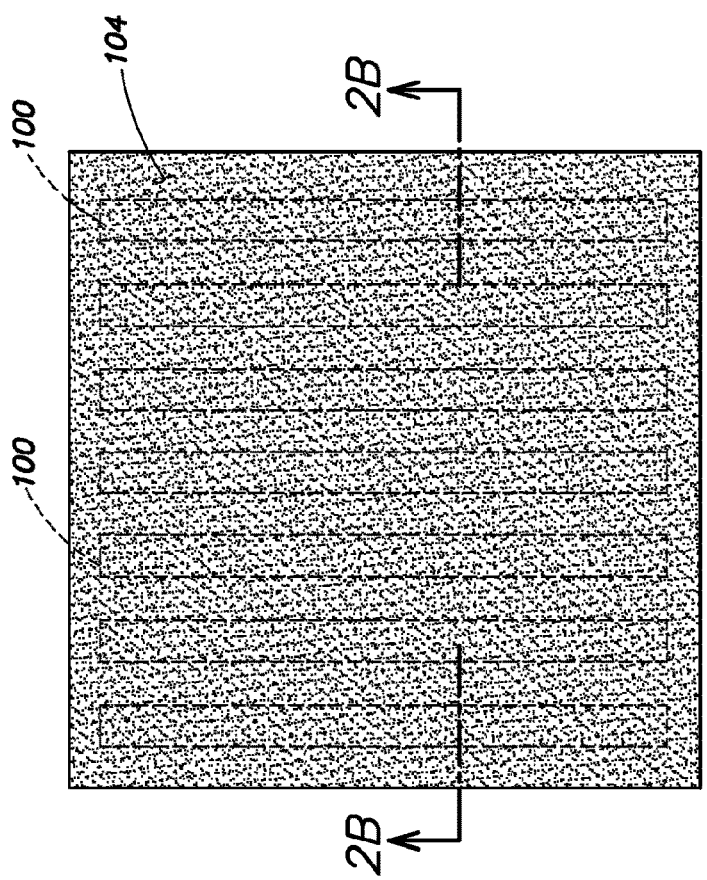
FIG. 2B
FIG. 2A

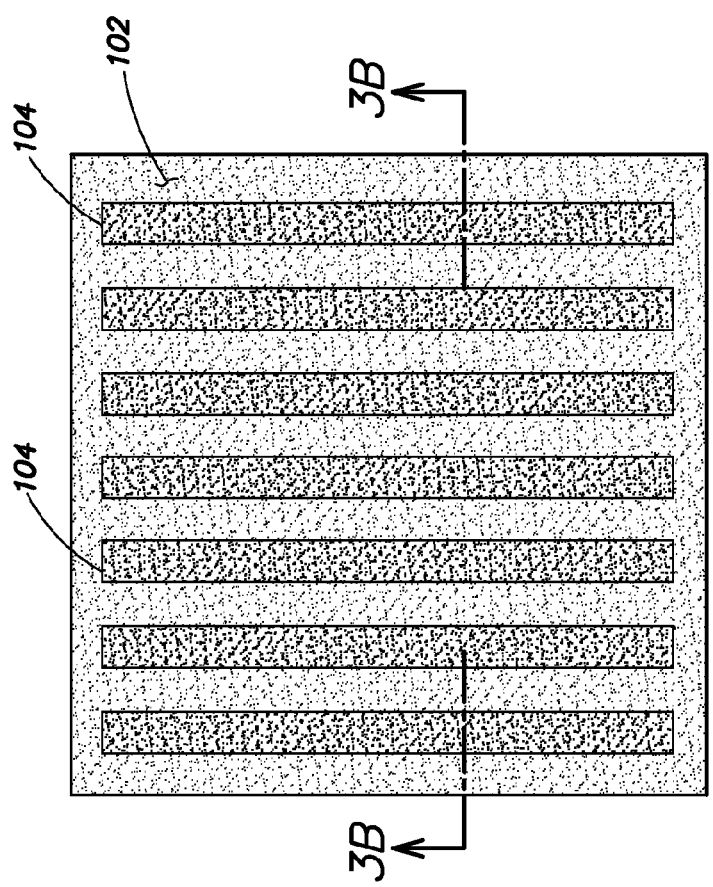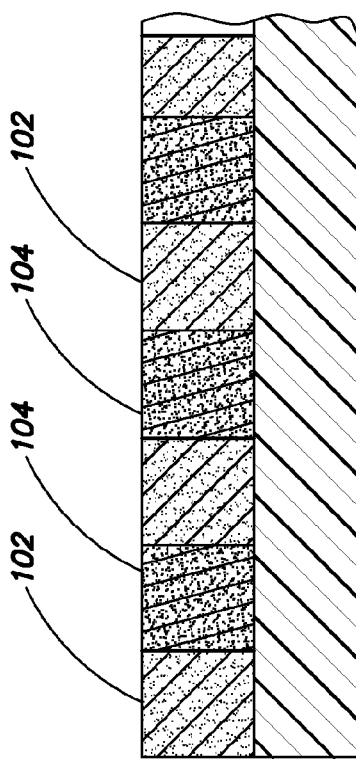
FIG. 3A
FIG. 3B

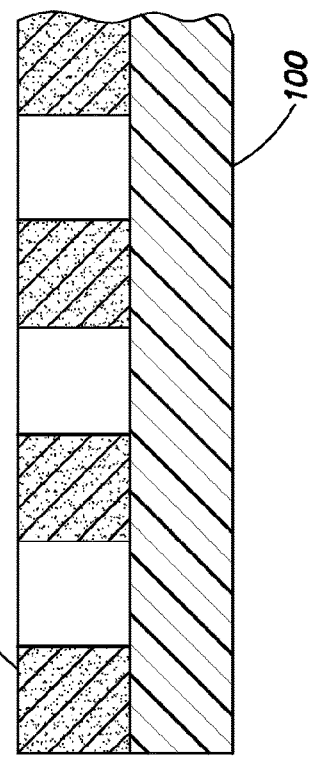
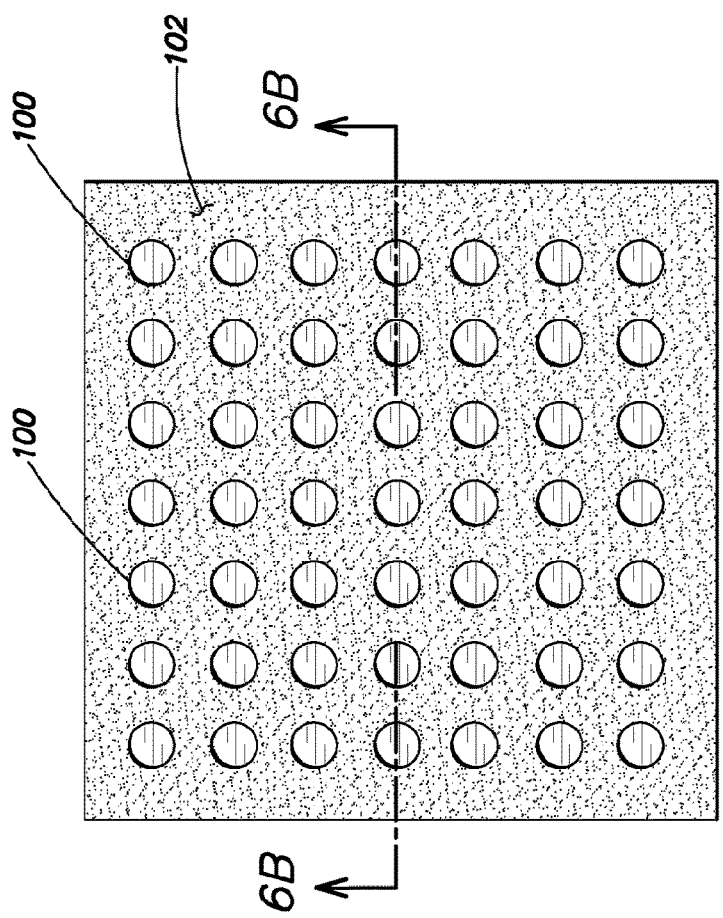
FIG. 6B
FIG. 6A

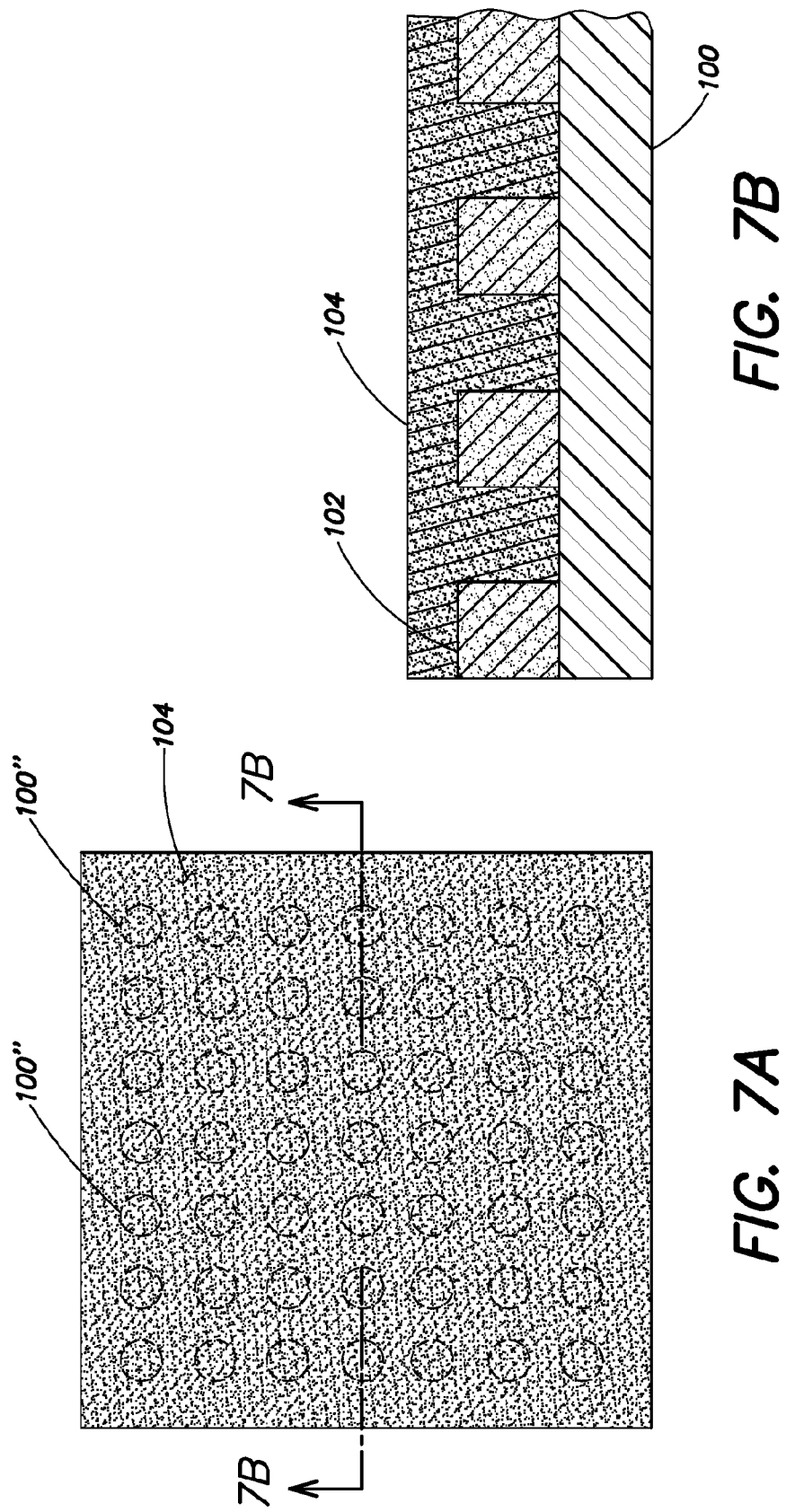

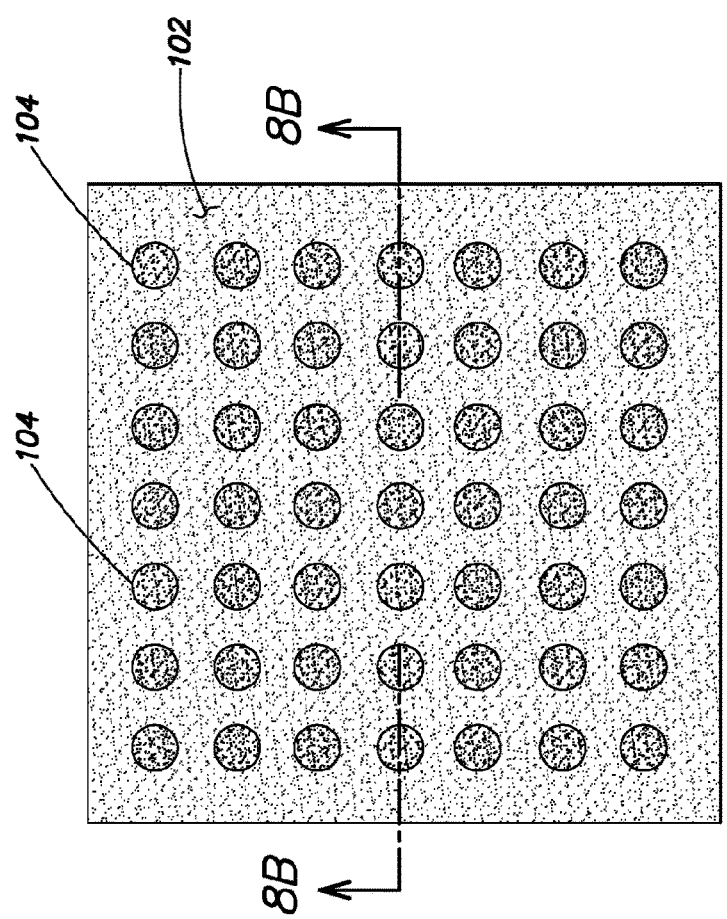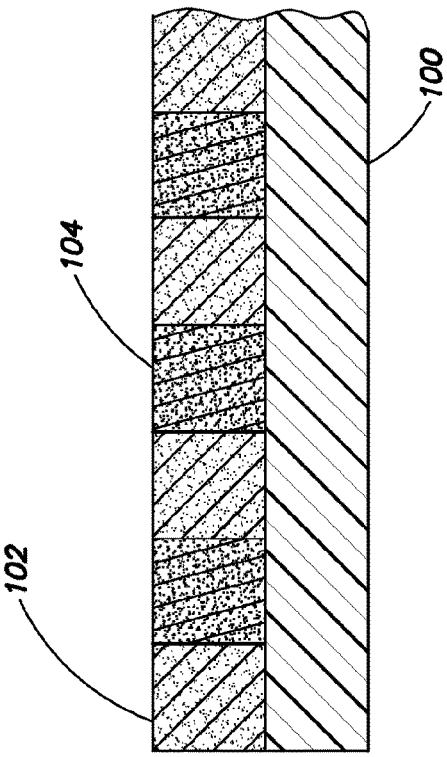
FIG. 8A
FIG. 8B

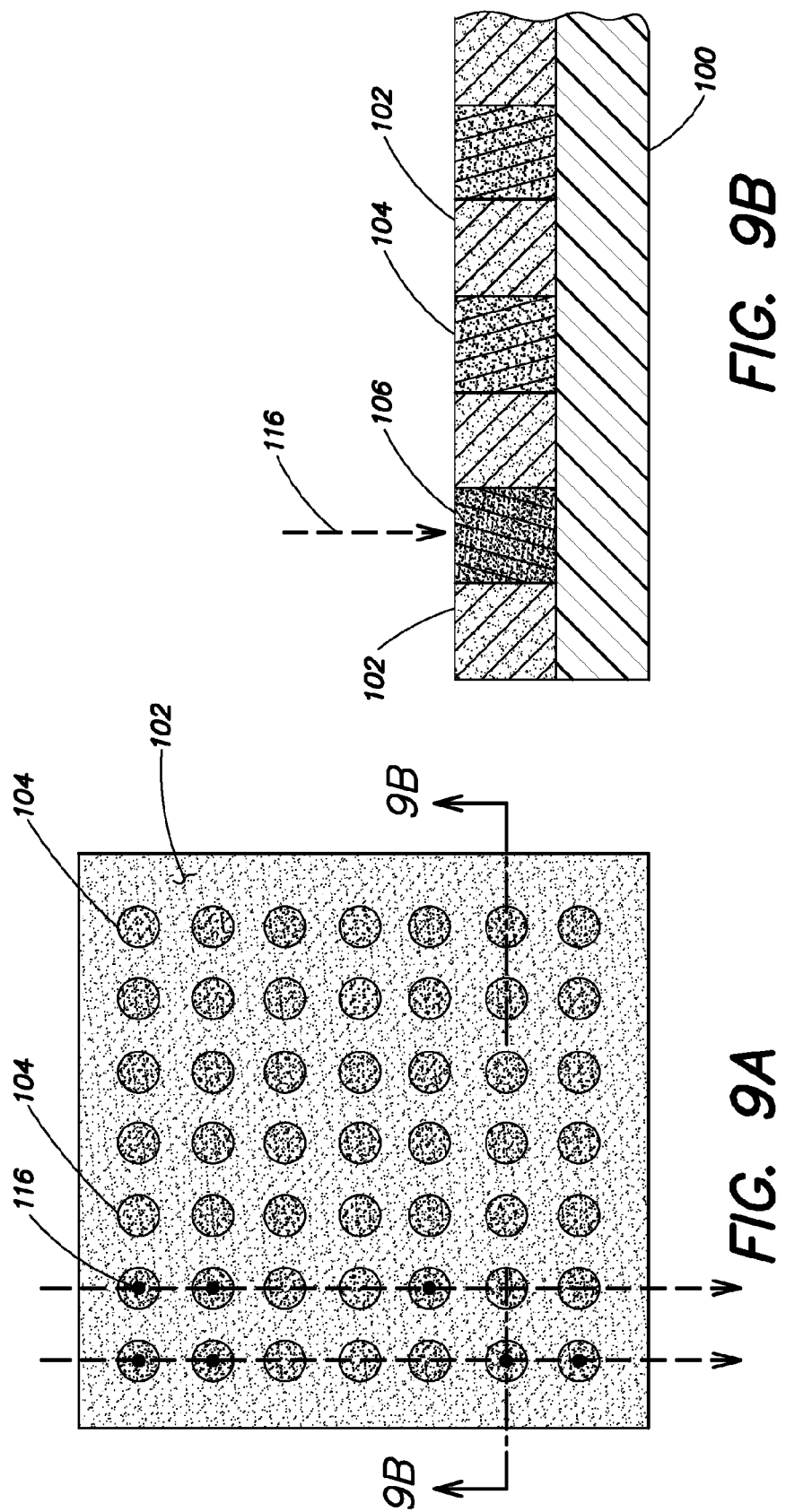

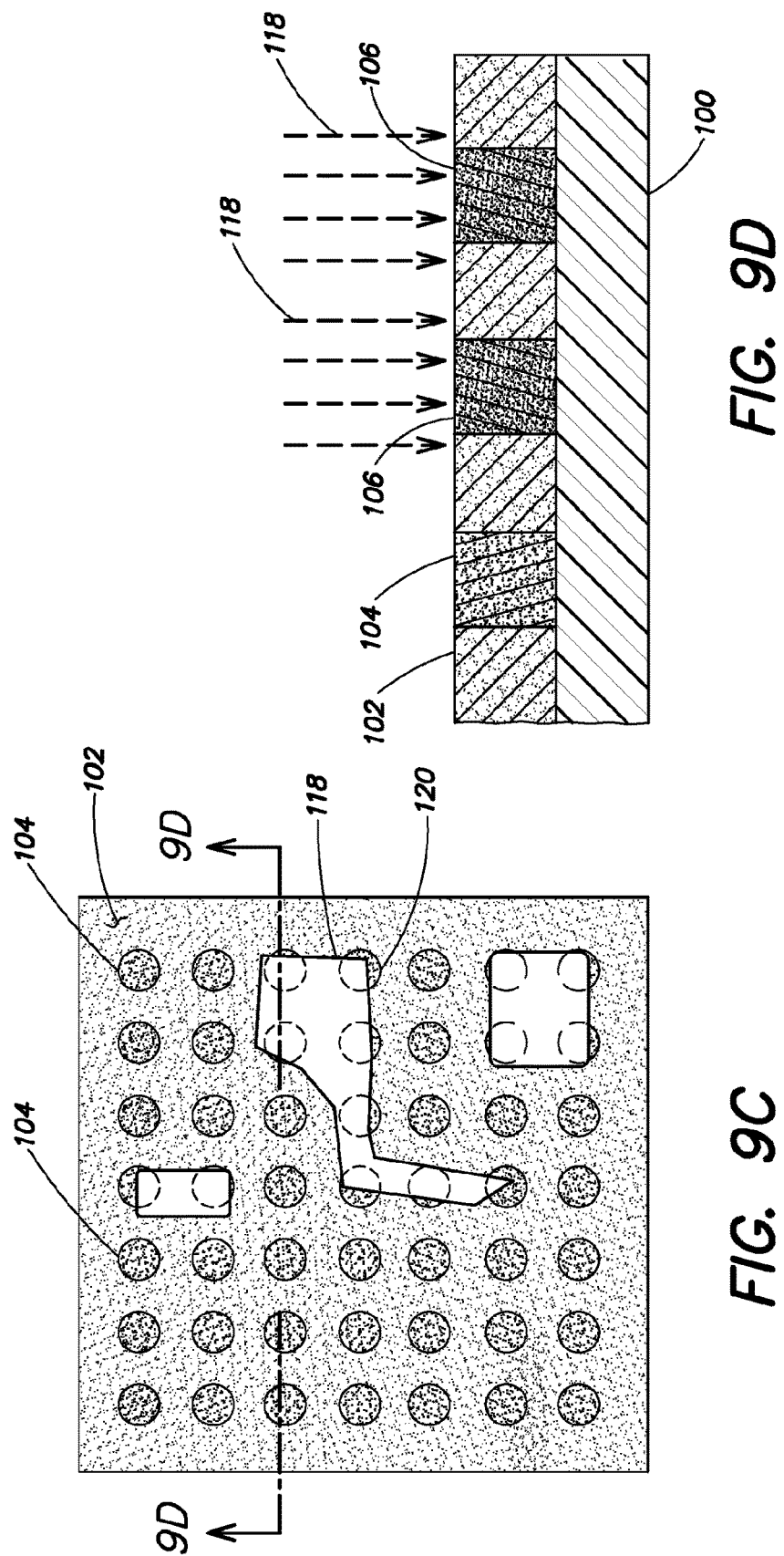

METHODS AND APPARATUS FOR FORMING A RESIST ARRAY USING CHEMICAL MECHANICAL PLANARIZATION

CROSS-REFERENCE TO RELATED APPLICATION

The present application is the U.S. National Phase of International Patent Application No. PCT/US2014/054147which was filed Sep. 4, 2014 and which claims priority to U.S. Provisional Patent Application No. 61/874,349, filed on Sep. 5, 2013 entitled "METHODS AND APPARATUS FOR FORMING A RESIST ARRAY USING CHEMICAL MECHANICAL PLANARIZATION" both of which are hereby incorporated by reference herein their entirety for all purposes.

FIELD

Embodiments of the present invention generally relate to electronic semiconductor device manufacturing, and more particularly are directed to patterning methods, systems, and apparatus.

BACKGROUND

Lithography technology has been one of the key enablers and drivers for the semiconductor industry for the past several decades. Improvements in lithography are responsible for roughly half of the improvement in cost per function in integrated circuit (IC) technology. The underlying reason for the driving force in semiconductor technology has been the ability to keep the cost for printing a silicon wafer roughly constant while exponentially reducing the transistor size, therefore dramatically increasing the number of transistors that can be printed per chip at a rate known as Moore's law. ICs have been printed optically with improvements in lens and imaging material technology along with decreases in wavelength used fueling the steady improvement of lithography technology. However, the end of optical lithography technology has been predicted by many and for many years. Many technologies have been proposed and developed to improve on the performance of optical lithography, some succeeded; but the cost and complexity grew rapidly. Alternative techniques were proposed and developed, but to date, none have succeeded. This has been true largely because it has been more economical to advance incremental improvements in the existing optical technology rather than displace it with a new one. What is needed are methods and apparatus for improving the performance (e.g., resolution) of lithography without making the process non-economical or impracticable for production.

SUMMARY

Inventive methods and apparatus provide for patterning material on a substrate. In some embodiments, the methods may include forming a resist array on the material to be patterned using chemical-mechanical polishing (CMP), the resist array including an arrangement of a first material and a second material, the first material being disposed as isolated nodes between the second material, wherein the first and second materials are adapted to react to activation energy differently relative to each other to enable selective removal of one of the first and second materials; selecting a subset of nodes from among the nodes in the array; and exposing the selected nodes to activation energy to activate the nodes and create a mask from the resist array.

In some embodiments, an electronic device formed using a resist array is provided. The electronic device can include a structure patterned in a first material using a resist array formed using CMP, the resist array including an arrangement of a second material and a third material, wherein the second and third materials are adapted to react to activation energy differently relative to each other to enable selective removal of one of the second and third materials, the second material being disposed as isolated nodes between the third material, a subset of nodes having been selected from among the nodes in the array, and the selected nodes having been exposed to activation energy to activate the nodes and create a mask from the resist array.

In some embodiments, a system for planarizing a resist array is provided. The system can include a polishing head assembly including a thermal control system and adapted to hold a substrate; and a polishing pad disposed on a platen and adapted to be held against the substrate while the polishing pad and the polishing head assembly are rotated relative to each other, wherein the thermal control system is operative to control the temperature of the resist on the substrate.

Numerous other aspects are provided. Other features, embodiments, and aspects of the present invention will become more fully apparent from the following detailed description, the appended claims and the accompanying drawings.

BRIEF DESCRIPTION OF THE DRAWINGS

FIGS. 1A and 1B are magnified top plan and side cross-sectional schematic diagrams depicting a substrate including a trench pattern in hardmask according to embodiments of the present invention.

FIGS. 2A and 2B are magnified top plan and side cross-sectional schematic diagrams depicting a substrate including a trench pattern in hardmask coated with resist according to embodiments of the present invention.

FIGS. 3A and 3B are magnified top plan and side cross-sectional schematic diagrams depicting a substrate including a trench pattern in hardmask with resist filling the trenches according to embodiments of the present invention.

FIGS. 6A and 6B are magnified top plan and side cross-sectional schematic diagrams depicting a substrate including a gridded array pattern in hardmask according to embodiments of the present invention.

FIGS. 7A and 7B are magnified top plan and side cross-sectional schematic diagrams depicting a substrate including a gridded array pattern in hardmask coated with resist according to embodiments of the present invention.

FIGS. 8A and 8B are magnified top plan and side cross-sectional schematic diagrams depicting a substrate including a gridded array pattern in hardmask with resist filling the array nodes according to embodiments of the present invention.

FIGS. 9A and 9B are magnified top plan and side cross-sectional schematic diagrams depicting via cuts on a resist array with nodes selected through exposure to electrons (e.g., Electron Beam Direct Write (EbDW) scanning) according to embodiments of the present invention.

FIGS. 9C and 9D are magnified top plan and side cross-sectional schematic diagrams depicting via cuts on a resist array with nodes selected through exposure to photons (e.g., Extreme Ultraviolet (EUV) exposure) according to embodiments of the present invention.

DETAILED DESCRIPTION

Figure 4B:
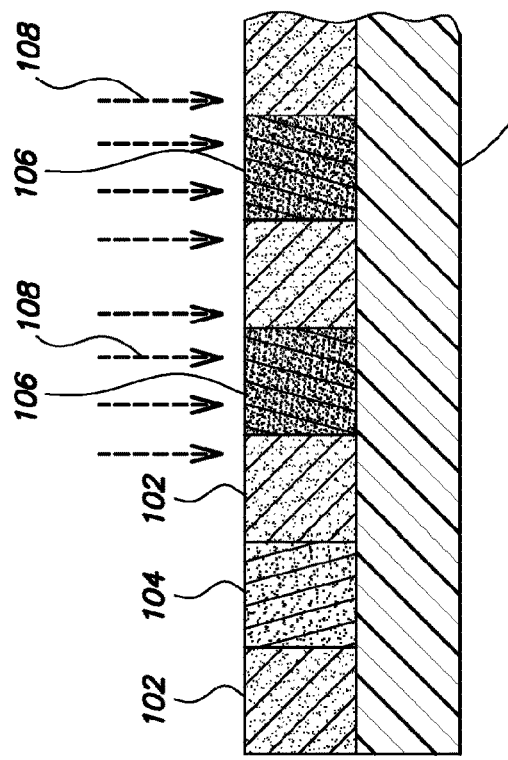
FIGS. 4A and 4B are magnified top plan and side cross-sectional schematic diagrams depicting line cuts via application of activation energy to selected portions of the resist lines according to embodiments of the present invention.

Embodiments of the present invention provide methods and apparatus for lithography using a resist array to improve the resolution performance of lithography without reducing throughput to impracticable levels. Leading-edge production lithography employs optical projection printing operating at the conventional optical diffraction limit. The image of the master pattern or mask (usually reduced by four or five times) is projected onto a substrate that has been coated with a layer of photosensitive material (e.g., resist). The solubility or selectivity of the resist is changed by exposure to light or other energy so that a pattern emerges upon development (e.g., much like a photograph). The remaining resist pattern is then used for subsequent process steps such as etching or implantation doping.

Conventionally, using lithography involves writing a pattern on a blanket layer of resist (e.g., a thin sheet of resist that covers the entire substrate). Current optical lithography provides resolutions that support 38 nanometer technology. At the point deep ultraviolet (DUV) lithography reaches its resolution limit, however, there appears to be no clear successor patterning lithography technology with better resolution with a practicable throughput rate. Most alternative technologies (e.g., extreme ultraviolet (EUV), direct write, nano-imprint, etc.) are not mature enough and can be too expensive to be useable for production. For example, the alternatives to DUV lithography, EUV and E-beam Direct Write (EbDW), in particular may suffer from throughput problems. From a technical point of view, it is possible to pattern features to atomic dimensions with advanced research techniques. However, these nanolithography methods tend to be very slow, very expensive, and are not practicable for production. One reason for their slow throughput is the requirement for large exposure doses of either photons or electrons; low doses result in shot noise or poor statistical sampling, which leads to line roughness or poor uniformity of hole size. To reduce the dosage requirements, it is possible to use chemical amplification of the photo-resists, but this relies on acid diffusion to create a cascading chemical reaction which leads to blurring of the solubility profile.

Nevertheless, continued design shrink has been achieved by using other non-optical methods, such as double patterning and pitch division through self-aligned double patterning (SADP) methods. Such methods can be used to form trench and gridded array patterns in hardmask materials, which then, according to embodiments of the present invention, can be used to create masks for line cuts and via cuts. With respect to cut lines, embodiments of the present invention relax resolution and overlay requirements in one direction and allow for the special optimization of illumination and overlay monitoring in the other (critical) direction. According to embodiments of the invention, resist applied to a trench pattern formed in hardmask is constrained between the trench walls of the hardmask and the top surface is planarized flush with the hardmask using chemical-mechanical polishing (CMP). The resulting aerial image intensity slope (i.e., contrast, for example in terms of normalized image log-slope (NILS)) is therefore relaxed in the constrained direction. In the case of via cuts, again using CMP, resist applied to a gridded array pattern formed in hardmask is planarized flush with the top surface of the hardmask and constrained in all directions inside the hardmask holes. The resulting aerial image intensity slope, dose, and overlay is relaxed in all directions. In addition, because the resist is physically encased on the sides by the hardmask, no acid diffusion induced blur can occur from chemically amplified photo-resists (CAR). This enables one to either use highly amplified resists or to use long pose exposure bakes (amplification reaction time) without worry of blurring. These highly amplified processes can then enable E-Beam Direct Write or EUV exposure doses to be very small, making their throughputs commercially viable.

The resist used can be a photoresist such as JSR AIM5484 if using 193 nm exposure light, JSR NXE12-174 if using 13 nm exposure light, or ZEP520 or a chemically amplified PMMA if using an E-Beam exposure tool. The resist can be applied to the hardmask and substrate via a spin coating process. The hardmask can be any number of conventional semiconductor materials such as SiO2 or Si3N4 or amorphous carbon.

Embodiments of the present invention use a resist that is either photo-reactive, e-beam reactive, X-Ray reactive, EUV reactive, ion implant reactive, or other directed energy source reactive. After the resist has been constrained in a hardmask trench or hole, an exposure process is conducted to "select" a portion of the resist line and/or a subset of resist nodes within a resist array for pattern transfer.

Thus, embodiments of the present invention are based on the idea of creating a small pitch resist pattern using a CMP processes. This allows creation of a periodic array of contacts or lines, which will herein be referred to as an array. Some advantages of embodiments of the present invention include providing a good solution for reducing pitch for lines and contacts, with good overlay, resolution, line edge roughness (LER), line width roughness (LWR), critical dimension uniformity (CDU), reduction of exposure dosage and more. Embodiments also provide a complementary method to "cut" or "trim" the periodic pattern of long lines (or dense contacts) at "random access locations" in order to allow small patterns of arbitrary length (or a sparse array of contacts). A trim process may be accomplished by optical lithography, and this process benefits from the fact that trimming employs a lower resolution than the trimmed array.

Embodiments of the present invention combine the benefits of creating ordered arrays of resist constrained within a hardmask using CMP and random access localization in such a way that the writing dose and accuracy can be reduced, thereby providing high throughput and high pattern quality. In place of the blanket sheet of resist used in conventional lithography, embodiments of the present invention use a pre-formed array of resist nodes for creating the desired features.

In some embodiments, methods such as multiple patterning, nano-imprint templates, etc. combined with CMP can be used to form an array of resist nodes (i.e., resist array). The resist array includes a two material array (of contacts, lines or other shapes) such that one material is responsive to the writer (e.g., the active material) while the other material is not (e.g., the inactive material, for example, the hardmask).

In some embodiments, a relatively strong chemically amplified resist (CAR) can be used as the responsive or active material, such that only a relatively small dose of energy is employed to activate the resist over a large area. Similarly, the overlay tolerance for activation dose placement is greatly relaxed by the diffusion effect of the CAR, which spreads the effect to the borders of the resist node. Thus, each discrete resist node in the array essentially has a binary resist state that can be toggled by writing with only a small dose, even if applied inaccurately. Using an EUV scanner at a very low dose, the desired pattern may be written in the array of resist nodes. This enables high throughput with EUV scanners. Likewise, as an alternative embodiment, using an EbDW scanner at a relatively low dose, with relatively low dose accuracy, and at relatively low positional accuracy, enables high throughput patterning of the resist array with such an EbDW scanner.

Embodiments of the present invention provide numerous advantages. The use of a hardmask to create the array of resist nodes provides accurate alignment, controls the CD, the LFR, and the LWR and provides improved resolution. This enables breaking of the binding relationships between resist resolution, LER, and resist sensitivity. This opens the way to increasing chemical amplification of the active resist material to allow the use of reduced writing dosage and allow for increased throughput. Embodiments of the present invention bypass the problem of resist point-spread function (PSF) which limits lithography resolution. Using a lower dose of activation energy is practicable for both exposure with photons, as in EUV, and by electrons, as in EbDW. In both cases, the benefits can be higher throughput and/or lower energy. In addition, embodiments of the present invention allow the use of EbDW at low beam current, therefore allowing faster scanning of the beam and lower beam voltage. Embodiments of the present invention also allow the use of EbDW on a predefined grid of the size of the printed pitch. This allows use of a significantly reduced number of parallel beams to implement a reasonable throughput rate with EbDW.

Alternatively, the need for a multi-pass scanning pattern is avoided and therefore, throughput is dramatically increased while significantly reducing the amount of information to be transferred to the writing beam. In fact, in some embodiments, only one bit (or less) per resist node may be used to describe the pattern to be written to the array of resist nodes.

Turning now to the drawings, a substrate undergoing process steps of an example method embodiment of the present invention is depicted in FIGS. 1A through 5. In FIGS. 1A and 1B, a substrate 100 is shown from a top aerial view and a magnified partial side cross-sectional view, respectively, with a pre-formed trench pattern of hardmask material 102 layered on top of the substrate 100. The trench pattern of hardmask material 102 can be formed using template imprint methods, pitch division through self-aligned double patterning (SADP) methods, and other methods such as interference lithography, double exposure, or directed self-assembly In FIGS. 2A and 2B, the substrate 100 with the patterned hardmask material 102 is again shown from a top aerial view and a magnified partial side cross-sectional view, respectively, but now with a layer of resist 104 applied to the substrate 100 and the patterned hardmask material 102. The resist 104 fills the trenches 100' and coats the top surface of the patterned hardmask material 102.

In FIGS. 3A and 3B, the top surface of the resist 104 has been planarized down flush with the top surface of the patterned hardmask material 102 using CMP. In some embodiments, as will be described in more detail below, the resist 104 can be altered to enhance or improve the CMP process. For example, the resist 104 can be cooled to make it more rigid and prevent the polishing pad used in the CMP process from becoming loaded up with the removed material. Other methods of altering the resist 104 or the CMP process itself to improve performance can be used.

Note that the resist 104 can be a chemically amplified resist that may be reactive to relatively low dosages of activation energy. In some embodiments, the hardmask material 102 is selected such that it is inert and does not react to activation energy, thus creating etch selectivity between the resist lines 104 and the surrounding hardmask material 102. In other words, the resist array may include an arrangement of two different materials 102,104 that are adapted to react to activation energy differently relative to each other to enable selective removal of only one of the materials (e.g., one is reactive and the other is not reactive; one is slightly reactive and the other is very reactive; one is reactive in one domain or direction and the other in an opposite domain or direction; etc.).

Other patterns of the hardmask and resist 102, 104 can be used. For example, hexagonal, pentagonal, octagonal, circular, diamond, compact, elongated, or any other shaped nodes of the resist 104 may be used. Further more, the grid may be an orthogonal grid, a triangular grid, a hexagonal grid, a pentagonal grid, an octagonal grid, or any other shape/type of arrangement of nodes, depending on the design of the pattern desired for substrate 100.

In some embodiments, the resist 104 may be any of a number of chemically amplified resists such as N-tert-butoxycarbonyl (t-BOC) protected PMMA resist containing photo-acid generators formed in a block-co-polymer with the hardmask material 102 including poly-styrene. In this example, the resist 104 is in the energy reactive domain and the hardmask material 102 is in the non-reactive domain.

In other embodiments, the resist 104 may be any of a number of chemically amplified resists such as t-BOC protected PMMA resist formed in a block-co-polymer with poly-styrene. A photo-acid generator may be applied to the entire resist array surface and during energy exposure only the t-BOC protected PMMA domains become "reacted" and developable (e.g., soluble) for pattern transfer.

Figure 4A:
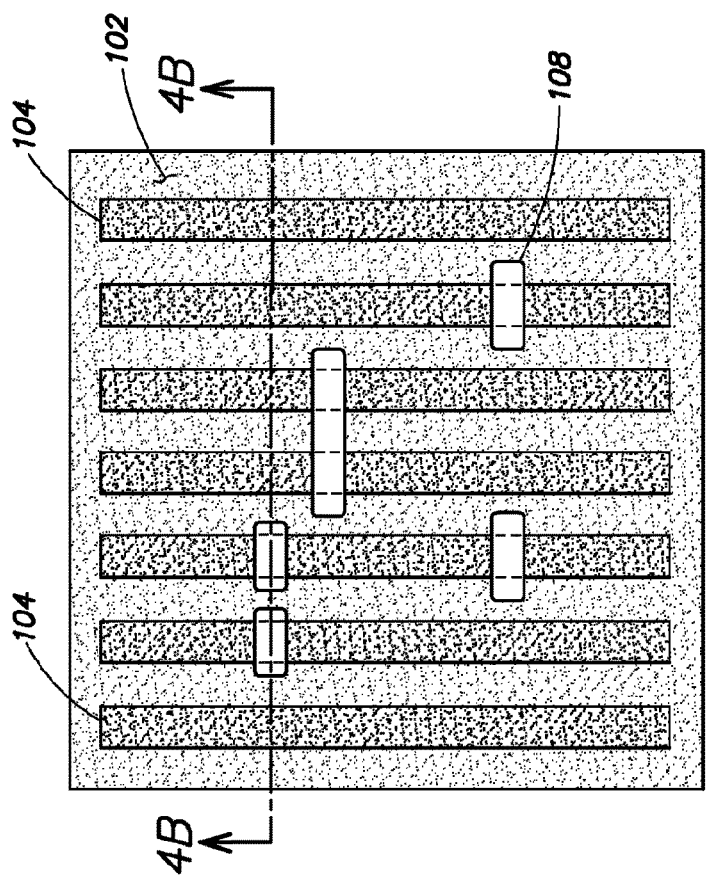
Figure 5:
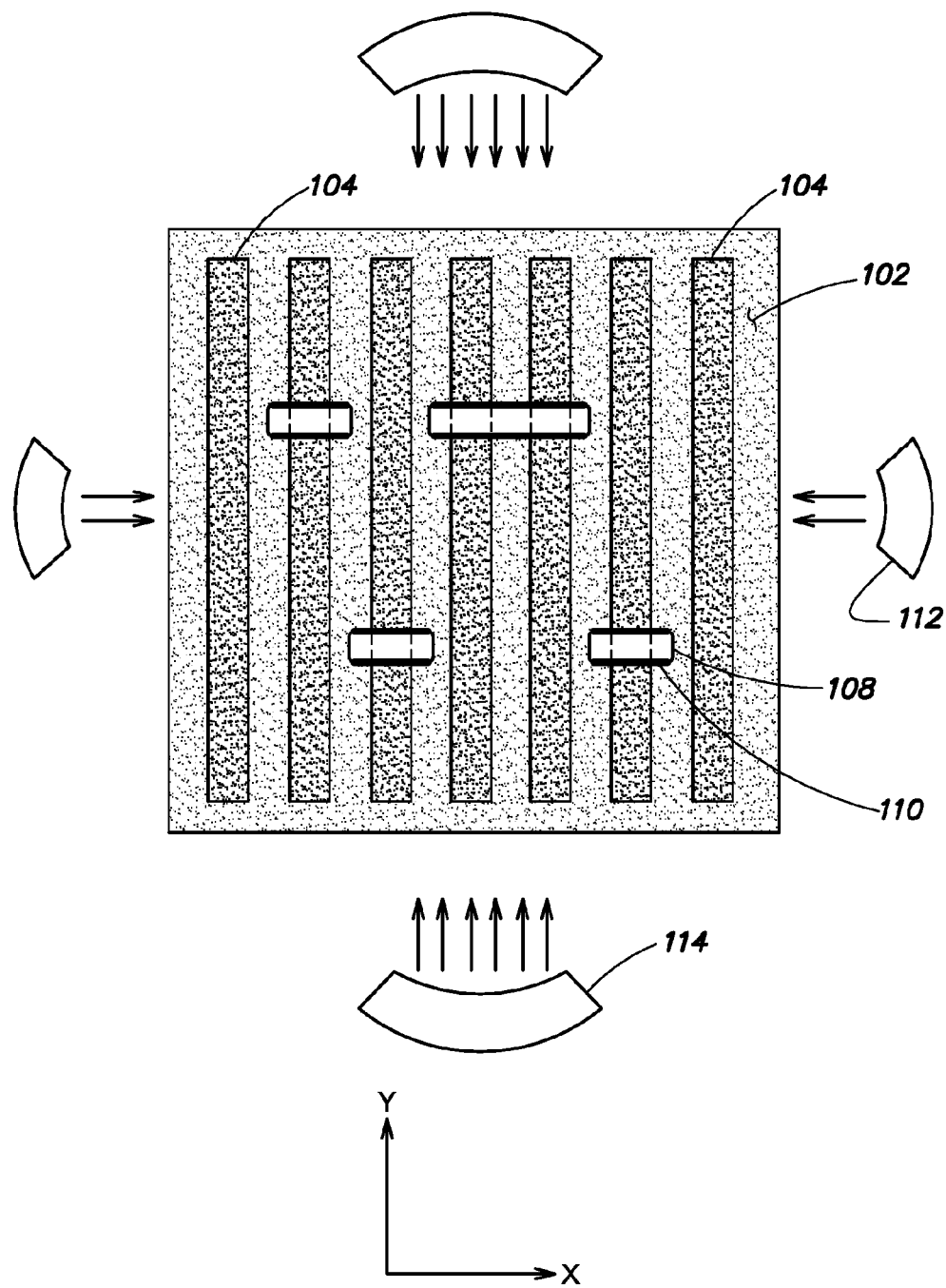
FIG. 5 is a magnified top plan schematic diagram depicting asymmetric illumination of the line cuts according to embodiments of the present invention.

Turning now to FIGS. 4A and 4B, activation energy 108 is shown being applied to a selected portion of the resist 104 to activate the selected portion to create exposed (e.g., activated) resist 108 line cuts. Note that as shown in more detail in FIG. 5, the contrast (e.g., NILS) tolerance requirement in the X-direction is relaxed and relatively high contrast (e.g., strong NILS) is only used in the Y-direction. Thus, the activation energy sources 112, 114 provide asymmetric, anisotropic illumination at the line cut (activation energy 108) with optimized NILS only in the Y-direction which favors NILS on the top and bottom of the cut shape. The sides are self-aligned in the X-direction by the hardmask material 102 and CMP process. In a next step, not shown, the activated portions of the resist (or in alternative embodiments, the un-activated portions of the resist) are removed to form the final desired pattern which then can be used, for example, as a mask for etching or other processes.

Turning now to FIGS. 6A through 9D, a substrate undergoing process steps of a second example method embodiment of the present invention is depicted. In FIGS. 6A and 6B, a substrate 100 is shown from a top aerial view and a magnified partial side cross-sectional view, respectively, with a pre-formed gridded array pattern of hardmask material 102 layered on top of the substrate 100. The trench pattern of hardmask material 102 can be formed using template imprint methods, pitch division through self-aligned double patterning (SADP) methods, and other methods such as interference lithography, double exposure, or directed self-assembly In FIGS. 7A and 7B, the substrate 100 with the patterned hardmask material 102 is again shown from a top aerial view and a magnified partial side cross-sectional view, respectively, but now with a layer of resist 104 applied to the substrate 100 and the patterned hardmask material 102. The resist 104 fills the holes 100" and coats the top surface of the patterned hardmask material 102.

In FIGS. 8A and 8B, the top surface of the resist 104 has been planarized down flush with the top surface of the patterned hardmask material 102 using CMP. In some embodiments, as will be described in more detail below, the resist 104 can be altered to enhance or improve the CMP process. For example, the resist 104 can be cooled to make it more rigid and prevent the polishing pad used in the CMP process from becoming loaded up with the removed material. Other methods of altering the resist 104 or the CMP process itself to improve performance can be used.

Note that the resist 104 can be a chemically amplified resist that may be reactive to relatively low dosages of activation energy. In some embodiments, the hardmask material 102 is selected such that it does not react to activation energy, thus creating etch selectivity between the resist 104 nodes and the surrounding hardmask material 102. In other words, the resist array may include an arrangement of two different materials 102, 104 that are adapted to react to activation energy differently relative to each other to enable selective removal of only one of the materials (e.g., one is reactive and the other is not reactive; one is slightly reactive and the other is very reactive; one is reactive in one domain or direction and the other in an opposite domain or direction; etc.).

Other patterns of the hardmask and resist 102, 104 may be used. For example, square, hexagonal, pentagonal, octagonal, circular, oval, diamond, compact, elongated, or any other shaped nodes of the resist 104 may be used. Furthermore, the grid may be an orthogonal grid, a triangular grid, a hexagonal grid, a pentagonal grid, an octagonal grid, or any other shape/type of arrangement of nodes, depending on the design of the pattern desired for substrate 100.

In some embodiments, the resist 104 may be any of a number of chemically amplified resists such as N-tert-butoxycarbonyl (t-BOC) protected PMMA resist containing photo-acid generators formed in a block-co-polymer with the hardmask material 102 including poly-styrene. In this example, the resist 104 is in the energy reactive domain and the hardmask material 102 is in the non-reactive domain.

In other embodiments, the resist 104 may be any of a number of chemically amplified resists such as t-BOC protected PMMA resist formed in a block-co-polymer with poly-styrene. A photo-acid generator may be applied to the entire resist array surface and during energy exposure only the t-BOC protected PMMA domains become "reacted" and developable (e.g., soluble) for pattern transfer.

Turning now to FIGS. 9A and 9B, activation energy 108 is shown being applied to selected resist 104 nodes to activate the selected nodes to create exposed (e.g., activated) resist 108 via cuts. In a next step, not shown, the activated portions of the resist (or in alternative embodiments, the un-activated portions of the resist) are removed to form the final desired pattern which then can be used, for example, ask a mask for etching or other processes.

As seen in FIG. 9A, individually selected nodes 116 are identified for activation with EbDW as the e-beam scans each column of resist nodes of the resist 104. For embodiments using EbDW scanning to activate the resist 104, the dosage of e-beam energy may be in the range of approximately 10 to approximately $10^8$ electrons per node, for example. Other dosages may be employed. For example, for high resolution, one conventional would need a dosage in the range of 30 uC/cm$^2$ to 100 uC/cm$^2$ to achieve good statistics and avoid shot noise. However, according to embodiments of the present invention, one could use just approximately 0.5 uC/cm$^2$ to approximately 5 uC/cm$^2$ and rely on strongly amplified resists or long amplification bakes to complete the chemical solubility switch of the resist within the constrained hole.

As indicated by the solid circles on each of the selected nodes 116 to be activated, the e-beam, with a beam spot represented by the solid circles that only covers a portion of each node, is turned on as it rapidly passes over the selected nodes 116 and remains off as it passes over the unselected nodes. Thus, the activation process becomes analogous to a binary process wherein patterns of resist (with the desired resolution, LFR, WFR, and CDU) are merely selected from among the array of resist nodes instead of being entirely defined by the activation energy.

Alternatively, as seen in FIG. 9C, patterns of selected nodes of the resist 104 are identified for activation with exposure to low dose DUV/EUV energy. Note that the areas of exposure 118 indicated by the dashed cross-hatching generally encircling the selected nodes are not required to include the entire area of the selected nodes. In other words, according to embodiments of the present invention, only a portion of the selected node needs to be exposed in order to activate the entire node. Note for example, the node labeled with reference numeral 120 is only partially covered by the area of exposure 118 with activation energy. For embodiments using EUV exposure to activate the resist material, the dosage of EUV may be in the range of approximately 0.011000 mJ/cm$^2$ to approximately 1000 mJ/cm$^2$, for example. Other dosages may be employed. For example, for high resolution, one conventional would need a dosage in the range of 20 mJ/cm$^2$ to 100 mJ/cm$^2$ to achieve good statistics and avoid shot noise. However, according to embodiments of the present invention, one could use just approximately 0.5 mJ/cm$^2$ to approximately 5 mJ/cm$^2$ and rely on strongly amplified resists or long amplification bakes to complete the chemical solubility switch of the resist within the constrained hole.

In FIG. 9D, the exposed (e.g., activated) resist nodes 106 are indicated by the array nodes with a diagonal crisscross line pattern and the unexposed resist nodes of the resist material 104 are indicated by the array nodes with a checkerboard pattern. The resist nodes can be developed using a suitable developer solution (e.g., to remove exposed resist node 106 material). The substrate 100 can then be etched and the areas of the exposed/developed resist nodes 106 of FIG. 9D become etched patterns. For example, at least one material layer of the substrate 100 may be etched through the openings formed by activation/removal of selected nodes 106.

For any of the above embodiments, different types of materials may be used for the resist. The chosen materials may cause the resist to be a positive or a negative resist. In other words, a positive resist may be used where the selected/exposed nodes become soluble when activated, and once developed, the patterns are then etched; or a negative resist may be used where the selected/exposed nodes become stable (and the others are subsequently washed out during development) and after an etch step, only material under the nodes remains.

Figure 10:
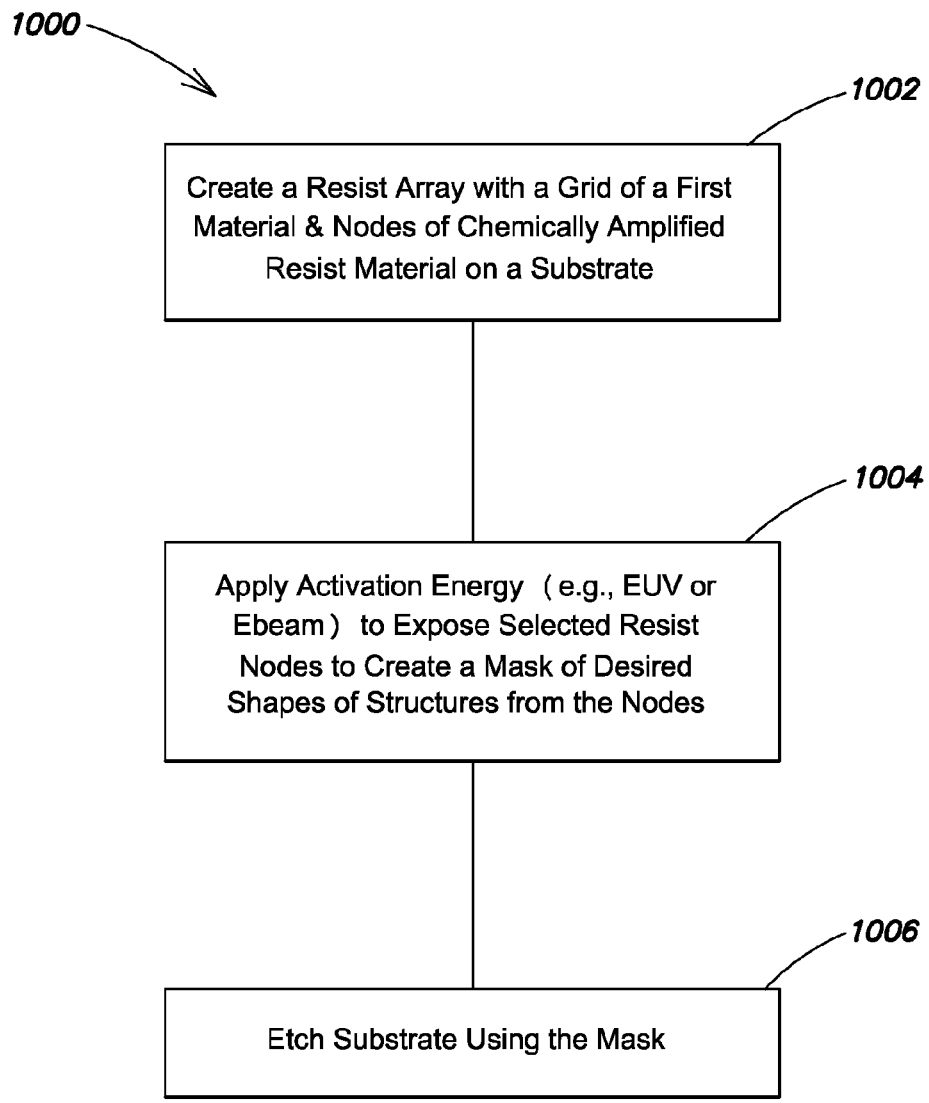
FIG. 10 is a flowchart depicting an example embodiment of methods according to the present invention.

Turning to FIG. 10, a flowchart depicting an example method 1000 according to embodiments of the present invention is depicted. A resist array is created on a substrate over a layer or layers of material(s) to be etched (1002). The layers under the resist array may include one or more of metal layers, silicon, hardmask layers, semiconductor layers, dielectric layers, organic layers or polymers, and/or the like.

The resist array includes a pattern of evenly spaced chemically amplified resist nodes that are reactive to relatively low dosages of activation energy and an intersecting, evenly spaced grid line pattern of inactive material that does not react to activation energy. The nodes fill the spaces between the gridlines. Thus, the nodes are isolated from each other by the gridlines. The grid and node patterns may be formed using SADP and CMP methods, for example.

In other words, an SADP process may be employed to create a dense array of holes in a first hard mask and a resist blanket may be applied to fill all of the holes. (If a positive resist is used, only those holes that are desired to remain open will be exposed to activation energy and if a negative resist is used, only the holes that are desired to remain closed will be exposed to activation energy.) CMP can be used to make the top surface of the resist flush with the top surface of the hardmask.

In some embodiments, the resist can be cooled during the CMP process, for example using a cooled chuck to cool the resist well below its glass transition temperature to allow it to be more easily planarized and to prevent loading of the CMP polishing pad. Most conventional photo-resists have a glass transition temperature of 50 C to 100 C, but to sufficiently harden the polymer further, make the behavior very glassy, and counteract the frictional heating of the CMP process, it is advantageous to cool the resist to approximately 20 C degrees to approximately -50 C degrees to make the resist more rigid and suitable for CMP processing.

In alternative embodiments, a weak solvent such as propylene glycol methyl ether acetate (PGMEA) with a concentration of 1 wt. % can be used to very weakly dissolve polymer resist as part of the removal and planarization process, as well as keep the polishing pad from loading up with polymer. In some embodiments, particularly where polymer solvent chemistries are used, instead of cooling the resist, the resist can be heated to help enhance the controlled removal of the resist. After CMP, selected nodes are energized/activated and once the desired pattern is developed, the substrate can be etched to pattern a second hard mask under the array.

Low dose activation energy is applied to individually selected resist nodes to expose these nodes (1004). For example, EUV exposure may be used. Alternatively, EbDW energy may be employed. In some embodiments, other energies and/or resist materials may be used. The selected resist nodes collectively form a pattern that represents the shape of the desired structure to be formed in the layer below the array. Any number of shapes may be created from the nodes including contact/via pads or holes, conductor lines, cut lines, device shapes, etc.

Following development of the activated nodes in a suitable developer, the substrate is etched and the resist node pattern is transferred to the underlying material (1006). In some alternative embodiments, multiple array layers may be stacked with a known offset equal to the width of the gridlines to allow more complex or contiguous patterns to be transferred to the underlying materials.

Figure 11:
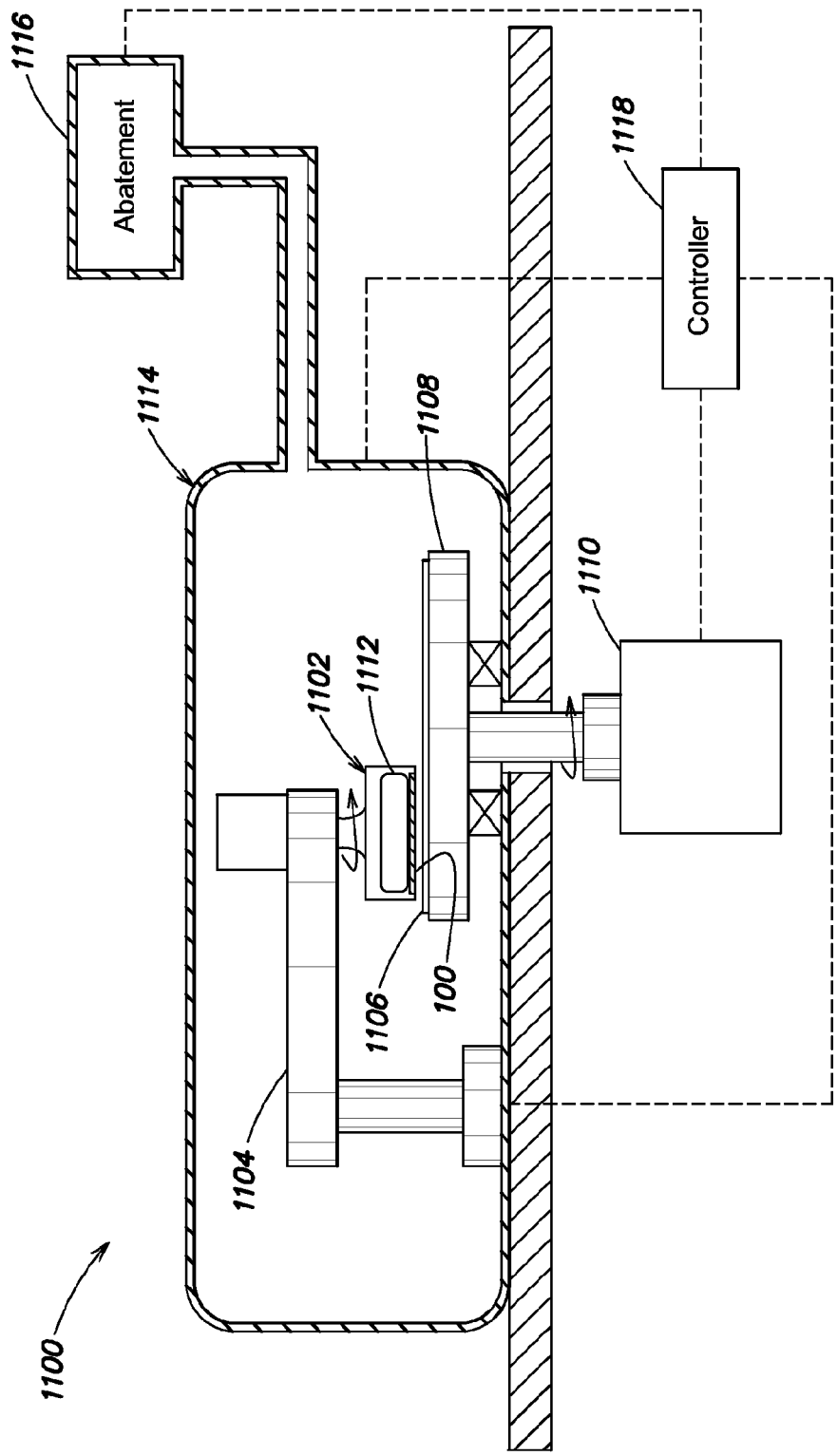
FIG. 11 is a schematic diagram depicting an example of a system useful in forming resist patterns and/or structures according to embodiments of the present invention.

Turning now to FIG. 11, a schematic diagram depicting a side view of an example system 1100 according to embodiments of the present invention is provided. The system 1100 includes a polishing head assembly 1102 supported by an polishing head arm 1104 operative to position the polishing head assembly 1102 over a polishing pad 1106 supported by and rotated on a platen 1108. The platen 1108 is driven to rotate by a motor 1110. In operation, the polishing head assembly 1102 is operative to securely hold a substrate 100, to rotate the substrate 100, and to press the substrate 100 against the rotating polishing pad 1106 during CMP processing. In other words, as the polishing pad 1106 is rotated on the platen 1108, the head 1102 rotates and pushes the substrate 100 down against the polishing pad 106.

In some embodiments, the polishing head assembly 1102 may include a thermal control system 1112 operative to, for example, reduce the temperature of the substrate 100 and materials on the substrate 100. In alternative embodiments, instead of cooling the resist, the resist can be heated to near its glass transition temperature (e.g., 50 C. to 120 C.) to ease removal by a weak solvent process. Thus, the thermal control system can be operative to raise the temperature of the substrate 100 and materials thereon. The thermal control system 1112 can be used to improve CMP performance in removal of resist material from the substrate 100, for example, by preventing loading (i.e., loading up with polymer) of the polishing pad 1106 by either cooling the resist below its glass transition temperature to keep it as a glass or by incorporating solvent into the process, to polish the resist flush with the top surface of the hardmask.

In some embodiments, the system 1100 can include a sealable chamber 1114 to contain fumes and other byproducts of the CMP process such as, for example, in embodiments where chemical solvents are used in the polishing slurry to help remove resist. Such chemicals can emit fumes or other byproducts that present safety hazards. In such embodiments, the sealable chamber 1114 can be vented to an abatement system 1116 to process any hazardous materials.

Each of the above components can be coupled to, and operated by, a controller 1118 (e.g., a processor, programmable logic array, embedded controller, computer, etc.) operative to execute instructions (e.g., software, programs, commands, signals, etc.) to perform the method embodiments of the present invention, and in particular, the methods described above with respect to the flowchart in FIG. 10.

Accordingly, while the present invention has been disclosed in connection with the example embodiments thereof, it should be understood that other embodiments may fall within the spirit and scope of the invention, as defined by the following claims.

The invention claimed is:
1. A method for patterning material on top of a substrate, the method comprising:
applying a first material to spaces between a patterned second material to form a resist array, the first material disposed as isolated nodes between the second material, wherein the first and second materials react to activation energy differently relative to each other to enable selective removal of one of the first and second materials; after the applying, planarizing the first material flush with a top surface of the second material;
selecting a subset of nodes from among the isolated nodes in the resist array;

exposing the subset of nodes to activation energy to activate the subset of nodes and create a mask from the resist array; and etching at least one material layer of the substrate using the mask created from the resist array, wherein the first material is a chemically amplified resist, and wherein the activation energy is in the form of extreme ultra-violet (EUV) light and is applied using a low dose EUV exposure process with a dose up to Eo<5 mJ/cm2 or wherein the activation energy is in the form of an electron beam and is applied using a low dose EbDW process with a dose up to Eo<5 mJ/cm2.

2. The method of claim 1 wherein one of the first and second materials is a chemically amplified resist, wherein the first material is a photon sensitive or electron beam sensitive chemically amplified resist and the second material is a predominantly inert hardmask.

3. The method of claim 1 wherein one of the first and second materials is a resist that is not chemically amplified, wherein the first material is a photon sensitive or electron beam sensitive chemically amplified resist and the second material is a predominantly inert hardmask.

4. The method of claim 3 wherein a chemical reaction amplifier component is added by spin-coating to convert the resist that is not chemically amplified into a chemically amplified resist.

5. The method of claim 1 wherein the selected subset of nodes forms a pattern to be transferred into the at least one material layer of the substrate.

6. The method of claim 1 wherein the activation energy is in the form of extreme ultra-violet (EUV) light and is applied using an EUV exposure process or wherein the activation energy is in the form of an electron beam and is applied using an e-beam direct write (EbDW) process.

7. The method of claim 1 wherein the selected subset of nodes forms a pattern in the shape of an arrangement of at least one of contact layouts, line cuts, and conductor lines to be transferred into the at least one material layer of the substrate.

8. The method of claim 1 wherein the resist array is formed in at least one of an orthogonal grid, a rectangular grid, a triangular grid, a hexagonal grid, and an octagonal grid.

9. The method of claim 1 wherein exposing the subset of nodes to activation energy comprises providing asymmetric, anisotropic illumination to activate the subset of nodes and create a mask from the resist array.

* * * * *